United States Patent
Nickel

(10) Patent No.: US 12,028,992 B2
(45) Date of Patent: Jul. 2, 2024

(54) PUMP UNIT COMPRISING A CONNECTOR WITH PRESSURE COMPENSATION ELEMENT

(71) Applicant: NIDEC GPM GmbH, Auengrund OT Merbelsrod (DE)

(72) Inventor: Conrad Nickel, Troistedt (DE)

(73) Assignee: NIDEC GPM GMBH, Auengrund OT Merbelsrod (DE)

( * ) Notice: Subject to any disclaimer, the term of this patent is extended or adjusted under 35 U.S.C. 154(b) by 126 days.

(21) Appl. No.: 17/419,827

(22) PCT Filed: Feb. 20, 2020

(86) PCT No.: PCT/EP2020/054476
§ 371 (c)(1),
(2) Date: Jun. 30, 2021

(87) PCT Pub. No.: WO2020/173801
PCT Pub. Date: Sep. 3, 2020

(65) Prior Publication Data
US 2022/0087039 A1    Mar. 17, 2022

(30) Foreign Application Priority Data
Feb. 25, 2019   (DE) .......................... 102019104728.5

(51) Int. Cl.
*H05K 5/06* (2006.01)
*H05K 5/00* (2006.01)
*H05K 5/02* (2006.01)

(52) U.S. Cl.
CPC .......... *H05K 5/0069* (2013.01); *H05K 5/0017* (2013.01); *H05K 5/0213* (2013.01); *H05K 5/068* (2013.01)

(58) Field of Classification Search
None
See application file for complete search history.

(56) References Cited

U.S. PATENT DOCUMENTS 4,157,022 A * 6/1979 Crase .................... F16D 3/84
                                                464/11
5,137,522 A * 8/1992 Bron ................. G05D 7/0106
                                                604/9

(Continued)

FOREIGN PATENT DOCUMENTS

DE        8408092 U1    6/1984
DE   11 2013 004 771 T5  6/2015

(Continued)

OTHER PUBLICATIONS

Official Communication issued in International Patent Application No. PCT/EP2020/054476, mailed on May 29, 2020.

(Continued)

*Primary Examiner* — Xanthia C Relford
(74) *Attorney, Agent, or Firm* — Keating & Bennett, LLP

(57) ABSTRACT

A pump assembly includes an electric motor with a printed circuit board with a controller, a pump driven by the electric motor, a housing surrounding the printed circuit board, and a connector which is fastened on an outside of the housing by a flange, which covers an opening of the housing, and which includes contacts directly electrically contacting the printed circuit board. The contacts pass through the opening of the housing. The connector includes a main housing in which the contacts extend and which adjoins the flange. The connector includes a pressure compensator which is in the main housing.

10 Claims, 4 Drawing Sheets

(56) References Cited

U.S. PATENT DOCUMENTS

| | | | |
|---|---|---|---|
| 9,362,784 B2* | 6/2016 | Blaser | H02K 9/197 |
| 9,541,090 B2* | 1/2017 | Høj | F04D 29/628 |
| 9,543,803 B2* | 1/2017 | Høj | F04D 29/426 |
| 2010/0090635 A1* | 4/2010 | Andersen | H02K 11/33 |
| | | | 310/71 |
| 2015/0060245 A1* | 3/2015 | Raupach | H01H 9/047 |
| | | | 200/302.2 |
| 2015/0208525 A1 | 7/2015 | Negishi et al. | |
| 2016/0044814 A1* | 2/2016 | Drew | H05K 5/0004 |
| | | | 361/752 |
| 2016/0245283 A1* | 8/2016 | Chikaoka | F04C 13/008 |
| 2016/0258340 A1* | 9/2016 | Klippert | F01P 7/14 |
| 2017/0114612 A1* | 4/2017 | Lewkoski | B25B 13/48 |
| 2017/0171995 A1 | 6/2017 | Lee | |
| 2017/0199061 A1* | 7/2017 | Wotton | B60K 37/02 |
| 2017/0223854 A1 | 8/2017 | Nishida et al. | |
| 2019/0006066 A1* | 1/2019 | Suttner | H01B 17/305 |
| 2021/0003132 A1* | 1/2021 | Imai | F04D 29/086 |

FOREIGN PATENT DOCUMENTS

| | | | |
|---|---|---|---|
| DE | 10 2016 205 117 A1 | 11/2016 | |
| DE | 10 2016 224 469 A1 | 6/2017 | |
| DE | 10 2016 217 002 A1 | 8/2017 | |
| DE | 10 2016 217 002 B4 | 1/2019 | |
| DE | 10 2018 103 747 A1 | 8/2019 | |
| WO | WO-2019172196 A1 * | 9/2019 | F04D 13/06 |

OTHER PUBLICATIONS

Official Communication issued in International Patent Application No. PCT/EP2020/054476, issued on Aug. 25, 2020.

English translation of Official Communication issued in International Patent Application No. PCT/EP2020/054476, mailed on May 29, 2020.

* cited by examiner

_(1)_
PUMP UNIT COMPRISING A CONNECTOR WITH PRESSURE COMPENSATION ELEMENT

CROSS REFERENCE TO RELATED APPLICATIONS

This is a U.S. national stage of PCT Application No. PCT/EP2020/054476, filed on Feb. 20, 2020, and with priority under 35 U.S.C. § 119(a) and 35 U.S.C. § 365(b) being claimed from German Application No. 102019104728.5, filed Feb. 25, 2019; the entire disclosures of which are hereby incorporated herein by reference.

1. FIELD OF THE INVENTION

The present invention relates to a pump assembly.

2. BACKGROUND

Water pumps often feature DC motors. The DC motors include a rotor connected to a motor shaft and rotatably mounted in a housing. The rotor is provided with permanent magnets. A stator is arranged in the rotor, which carries a number of windings on an iron core. When suitably controlled, the windings generate a magnetic field that drives the rotor to rotate. The windings are usually wound in three phases and are accordingly provided with three electrical connections via which the windings can be connected to a controller (ECU). These controllers are used in particular in the engine compartment, where they are exposed to considerable temperature fluctuations that can lead to major pressure fluctuations inside the housing. To compensate for these pressure fluctuations, semipermeable diaphragms are known from the prior art, which allow air and also water vapor to pass through the diaphragm to the outside and inside via a vent opening, but not water in liquid form. In the case of water pumps used in the engine compartments of road vehicles, there is also a requirement to protect the pumps from steam pressure generated by jets from steam pressure cleaners.

SUMMARY

Example embodiments of the present disclosure provide pump assemblies each including a connector that is as simple as possible and a venting element that is as simple as possible.

A pump assembly according to an example embodiment of the present disclosure includes an electric motor with a printed circuit board carrying a controller, a pump driven by the electric motor, a housing surrounding the printed circuit board, and a plug connector which is fastened on an outside of the housing, in particular on the housing cover, by a flange which covers an opening of the housing, in particular of the housing cover, and which includes contacts for direct electrical contact of the printed circuit board which passes through the opening of the housing. The plug connector includes a main housing in which the contacts extend and which adjoins the flange. The connector includes a pressure compensator that is in the main housing. The main housing can be straight or bent. By integrating the pressure compensator into the connector, the manufacturing process is significantly simplified. Preferably, the pressure compensator is provided at a side of the main housing remote from and opposite to a bend in the main housing. The connector preferably includes a connection area for a connector plug located outside the housing.

It is advantageous if the pressure compensator includes a water-impermeable membrane inserted into a first opening of a vent channel, the vent channel passing through the main housing from the first opening to a second opening, the second opening lying in the region of the opening of the housing. The first opening is on the side remote from the bend.

The water-impermeable membrane can be connected to the connector by ultrasonic welding, laser beam welding, or adhesive bonding.

Preferably, the membrane is at least partially covered by a protective geometry on an outside. This protective geometry protects the membrane from damage by water vapor. For example, the protective geometry may be a box-shaped cover that includes openings to vent the housing. Preferably, the cover includes the openings to vent the housing in its edge.

In an advantageous example embodiment, the protective geometry can be connected to the main housing by clips or latches. However, it can also be provided that the cover is fastened by ultrasonic or laser welding.

In one example embodiment, the vent channel extends at least partially parallel to and spaced apart from the contacts in the main housing of the connector.

The housing is a metal housing. The housing is preferably the pump and/or motor housing. The pump assembly is preferably a water pump assembly or water pump used in a motor vehicle.

In one example embodiment, the pressure compensator is located in the main housing outside a connection area, preferably on a side remote from a bent portion of the main housing.

The above and other elements, features, steps, characteristics and advantages of the present disclosure will become more apparent from the following detailed description of the example embodiments with reference to the attached drawings.

BRIEF DESCRIPTION OF THE DRAWINGS

Example embodiments of the present disclosure is explained in more detail below with reference to the drawings. Similar or similarly acting components are designated in the figures with the same reference signs.

DETAILED DESCRIPTION

Figure 1:
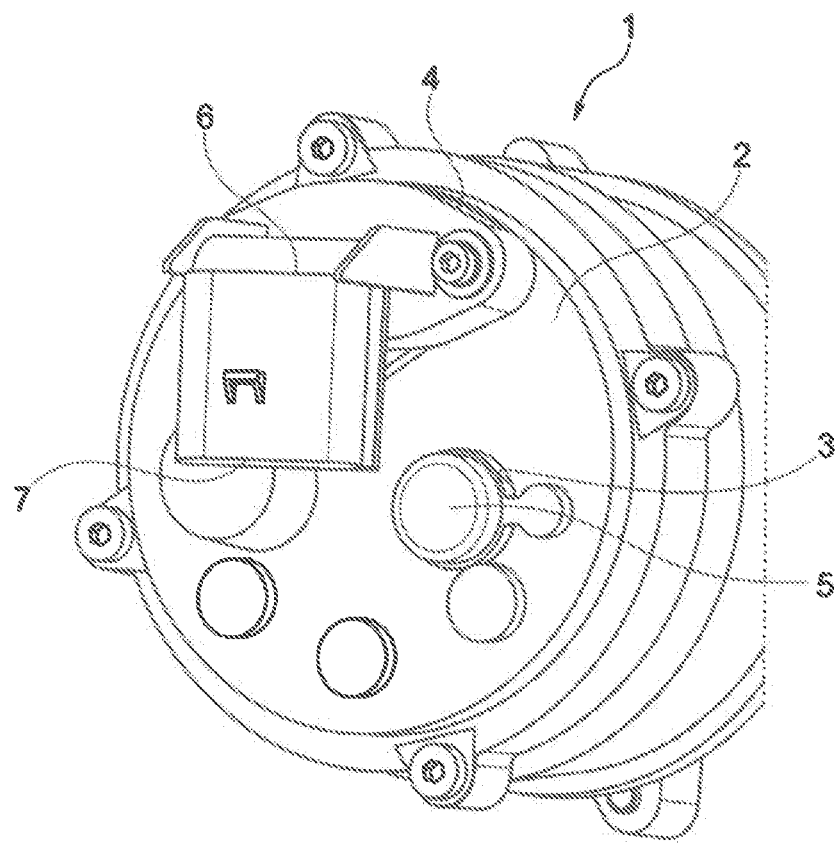
FIG. 1 is a top view of a water pump with a connector and a pressure compensation element.

FIG. 1 shows a water pump assembly 1 with a housing 2. An electric motor, a printed circuit board carrying a controller and a pump are arranged inside the housing 2. The housing cover of the housing 2 has two openings 3, 4 on the end face near the circuit board. A diaphragm with clip is inserted into a first opening 3 to form a pressure compensation element 5. The second opening 4 is closed by a plug connector 6. The connector 6 directly contacts with its contacts the printed circuit board located inside the housing 2. For connection of the controller, the connector 6 has a connection area 7 for a connector plug not shown, which is located outside the housing 2.

Figure 2:
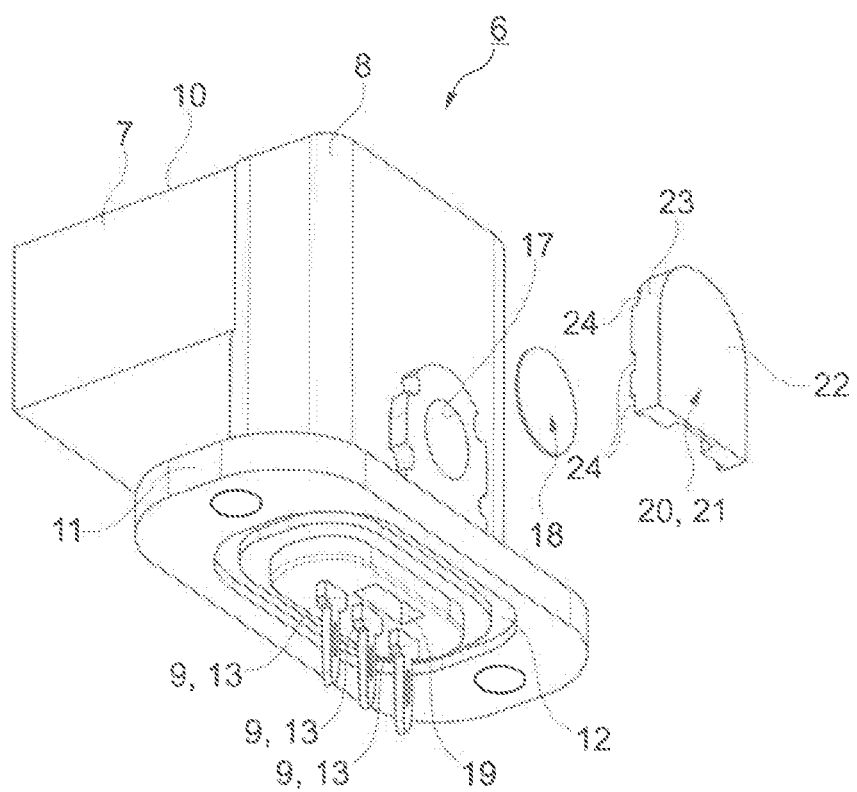
FIG. 2 is a spatial view of a connector with exploded view of a pressure compensation element according to an example embodiment of the present disclosure.
Figure 3:
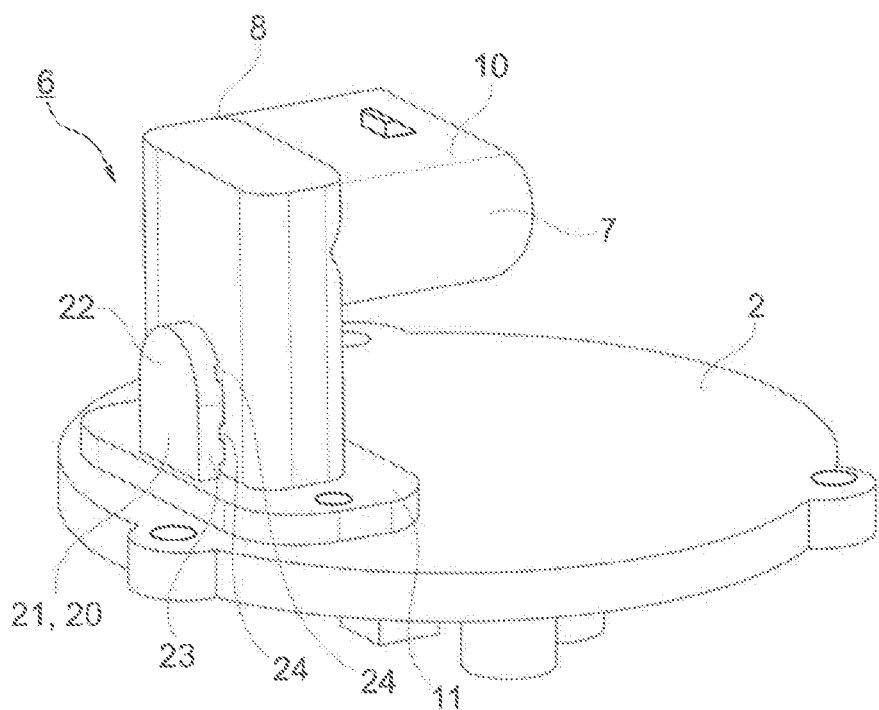
FIG. 3 is a further spatial view of the connector from FIG. 2.
Figure 4:
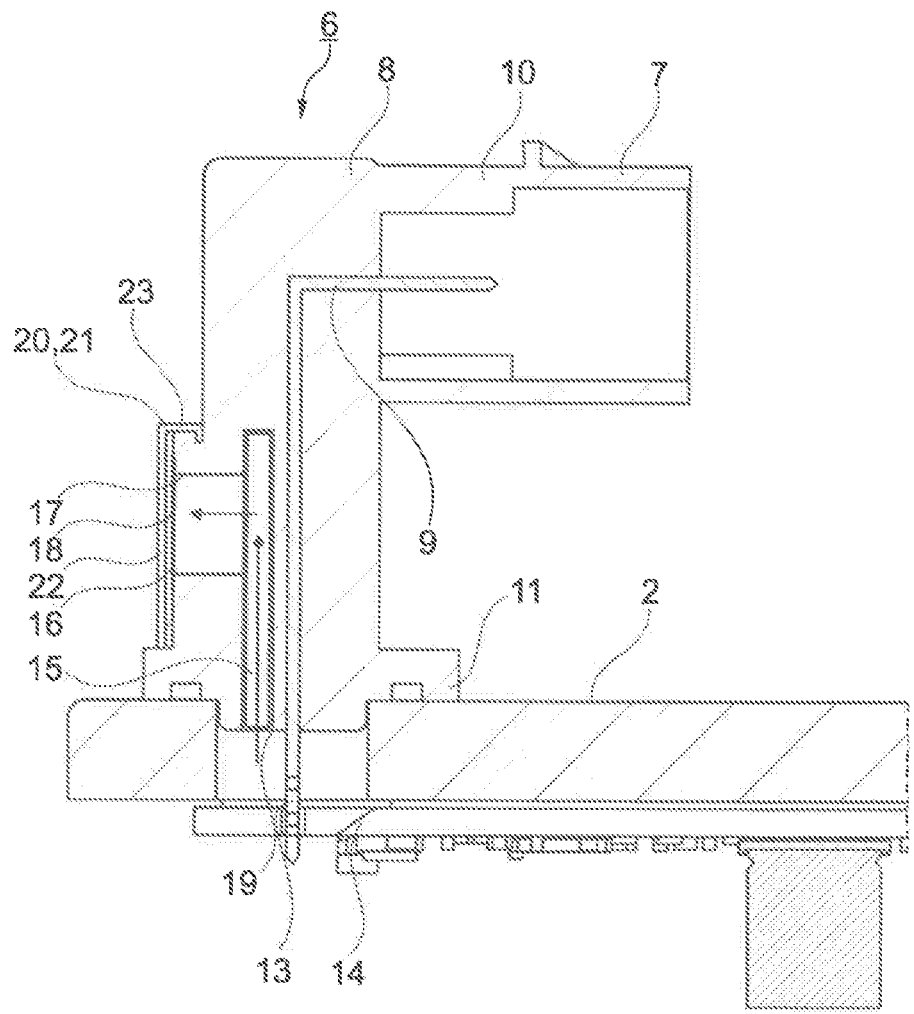
FIG. 4 is a longitudinal section through the connector of FIG. 2.

FIGS. 2 to 4 show an example embodiment of a connector 6 according to the disclosure, which, as previously described, electrically contacts the printed circuit board of a pump and has a connection area 7 for a connector plug located outside the housing. The connector 6 has a cylindrical and rectangular, bent main housing 8. Contacts 9 extend in the main housing 8. The contacts 9 represent a conductive structure, which is preferably made of sheet copper by stamping. The contacts 9 are bent by about 90° and run radially outwards, parallel to the surface of the housing 2, in an end region, the bend 10, remote from the pump housing. A flange 11 for fastening the plug connector 6 to the housing cover of the housing 2 adjoins the main housing 8 on the side near the housing. The main housing 8 sits with its end region near the housing approximately vertically on the flange 11. The flange 11 has a closed groove 12 on its underside for insertion of a seal. Contact ends 13 project from the underside for direct electrical contact with the printed circuit board 14 comprising the controller. The contact ends 13 are bulbously shaped pins. In particular, they are designed as press-fit pins for press-fit contacting. The end region of the main housing 8 remote from the housing is designed as a connection region 7 for a connector plug. The main housing 8 has a venting channel 15 for a pressure compensation element 16. A first opening 17 of the channel 15 is arranged on the side of the main housing 8 remote from the offset. The first opening 17 is closed by a water-impermeable membrane 18 for pressure equalization. The membrane 18 is connected to the connector 6 or the first opening 17 by ultrasonic welding, laser beam welding or adhesive bonding. As shown in FIG. 4, the vent channel 15 runs within the main housing 8 approximately parallel to and spaced from the contacts 9. A second opening 19 of the channel 15 is located in the flange 11, namely in the area that interacts with the opening in the housing 2. The channel 15 is therefore angled at 90°.

The membrane 18 is at least partially covered by a protective structure 20 on the outside. This protective structure 20 serves to protect the membrane 18 from steam pressure. The membrane 18 is covered by a box-shaped cover 21 for protection against steam pressure. The bottom 22 of the cover 21 is thereby arranged at a distance from the surface of the main housing 8. The cover of the cover 21 is thus formed by the main housing 8 itself. The edge 23 of the cover 21 stands on the surface of the main housing 8 and has a plurality of openings 24 through which venting of the pressure compensation element 16, 18 arranged under the cover 21 takes place. The cover 21 may be secured to the main housing 8 by clips or detents. It may also be provided that the cover 21 is fastened by ultrasonic or laser welding.

By integrating the pressure compensation element 16, 18 into the connector 6, possible leakage points are reduced, and costs are also reduced since there are fewer sealing points. In addition, the installation position of the pump assembly can be selected as desired, since the pressure compensation element is surrounded by a suitable protective structure 20. The connector 6 is preferably manufactured in a single injection-molded part. The contacts 9 are overmolded with plastic during manufacture and thus are integrated into the design. The housing 2 of the pump assembly is preferably a metal housing. The housing can be the pump housing and/or the motor housing.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A pump assembly comprising:
   a printed circuit board carrying a controller; a housing surrounding the printed circuit board; and
   a plug connector which is fastened on an outside of the housing by a flange which covers an opening of the housing and which includes contacts to directly electrically contact the printed circuit board, the contacts passing through the opening of the housing; wherein
   the connector includes a main housing in which the contacts extend and which adjoins the flange; and
   the connector includes a pressure compensator in the main housing to vent the housing.

2. The pump assembly according to claim 1, wherein
   the pressure compensator includes a water-impermeable membrane in a first opening of a vent channel; and
   the vent channel passes through the main housing from the first opening to a second opening, the second opening being located adjacent to the opening of the housing.

3. The pump assembly according to claim 2, wherein the membrane is connected to the connector by ultrasonic welding, laser beam welding, or adhesive bonding.

4. The pump assembly according to claim 2, wherein the membrane is at least partially covered by a protective structure on the outside.

5. The pump assembly according to claim 4, wherein the protective structure includes a box-shaped cover including openings to vent the housing.

6. The pump assembly according to claim 5, wherein the cover includes openings in its edge to vent the housing.

7. The pump assembly according to claim 4, wherein the protective structure is connected to the main housing by clipping or latching.

8. The pump assembly according to claim 2, wherein the vent channel extends at least partially parallel to, and is spaced away from, the contacts.

9. The pump assembly according to claim 1, wherein the housing is a metal housing.

10. The pump assembly according to claim 1, wherein the main housing of the connector is bent and the pressure compensator is in the main housing on a side away from a bent portion of the main housing.

* * * * *